United States Patent
Tani et al.

(10) Patent No.: US 9,136,172 B2
(45) Date of Patent: *Sep. 15, 2015

(54) METHOD OF MANUFACTURING SEMICONDUCTOR DEVICE AND METHOD OF MANUFACTURING ELECTRONIC ASSEMBLY

(71) Applicant: FUJITSU LIMITED, Kawasaki-shi, Kanagawa (JP)

(72) Inventors: Motoaki Tani, Akashi (JP); Yoshikatsu Ishizuki, Yokohama (JP); Shinya Sasaki, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/747,883

(22) Filed: Jan. 23, 2013

(65) Prior Publication Data

US 2013/0217186 A1 Aug. 22, 2013

(30) Foreign Application Priority Data

Feb. 16, 2012 (JP) .................. 2012-031402

(51) Int. Cl.
- *H01L 21/00* (2006.01)
- *H01L 21/78* (2006.01)
- *H01L 21/56* (2006.01)

(Continued)

(52) U.S. Cl.
CPC ............... *H01L 21/78* (2013.01); *H01L 21/56* (2013.01); *H01L 21/568* (2013.01); *H01L 24/19* (2013.01); *H01L 24/96* (2013.01); *H01L 24/97* (2013.01); *H01L 21/561* (2013.01); *H01L 23/3128* (2013.01); *H01L 2224/24195* (2013.01); *H01L 2224/97* (2013.01); *H01L 2924/10253* (2013.01)

(58) Field of Classification Search
USPC .......................... 438/118, 125, 126, 127, 110
See application file for complete search history.

(56) References Cited

U.S. PATENT DOCUMENTS

| | | | | |
|---|---|---|---|---|
| 5,891,312 A | * | 4/1999 | Weeks et al. .................. | 427/540 |
| 7,015,075 B2 | * | 3/2006 | Fay et al. ..................... | 438/127 |

(Continued)

FOREIGN PATENT DOCUMENTS

| | | |
|---|---|---|
| CN | 1461050 A | 12/2003 |
| JP | 2000-133666 | 5/2000 |

(Continued)

OTHER PUBLICATIONS

Office Action of Chinese Patent Application No. 201310044990.4 dated Apr. 3, 2015.

(Continued)

*Primary Examiner* — Reema Patel
(74) *Attorney, Agent, or Firm* — Kratz, Quintos & Hanson, LLP

(57) ABSTRACT

A method of manufacturing a semiconductor device, includes: providing an adhesive layer on a support body; providing a semiconductor element on the adhesive layer; providing a resin layer on the adhesive layer, the semiconductor element being provided on the adhesive layer, and forming a substrate on the adhesive layer, the substrate including the semiconductor element and the resin layer; and removing the substrate from the adhesive layer, wherein an adhesive force of the adhesive layer in a direction in which the substrate is removed is less than an adhesive force of the adhesive layer in a planar direction in which the substrate is formed.

14 Claims, 18 Drawing Sheets

(51) Int. Cl.
*H01L 23/00* (2006.01)
*H01L 23/31* (2006.01)

(56) References Cited

U.S. PATENT DOCUMENTS

| | | |
|---|---|---|
| 7,202,107 B2 | 4/2007 | Fuergut |
| 7,314,832 B2 * | 1/2008 | Kountz et al. ............ 438/694 |
| 7,800,917 B2 * | 9/2010 | Shimada et al. ............ 361/795 |
| 2002/0011655 A1 | 1/2002 | Nishiyama |
| 2003/0219969 A1 | 11/2003 | Saito |
| 2006/0128063 A1 | 6/2006 | Yamano |
| 2006/0183269 A1 | 8/2006 | Fuergut |
| 2008/0261377 A1 * | 10/2008 | Celler ............ 438/456 |
| 2011/0151625 A1 | 6/2011 | Hoshino |
| 2011/0174370 A1 | 7/2011 | Tsai |
| 2013/0217184 A1 * | 8/2013 | Ishizuki et al. ............ 438/110 |

FOREIGN PATENT DOCUMENTS

| | | |
|---|---|---|
| JP | 4403631 B2 | 1/2010 |
| JP | 2011-134811 A1 | 7/2011 |
| TW | 201133899 A | 10/2011 |

OTHER PUBLICATIONS

Office Action dated Jun. 3, 2015, in counterpart Taiwanese Patent Application No. 102103669.
Office action dated Jul. 7, 2015, in counterpart Japanese application No. 2012-031402.

* cited by examiner

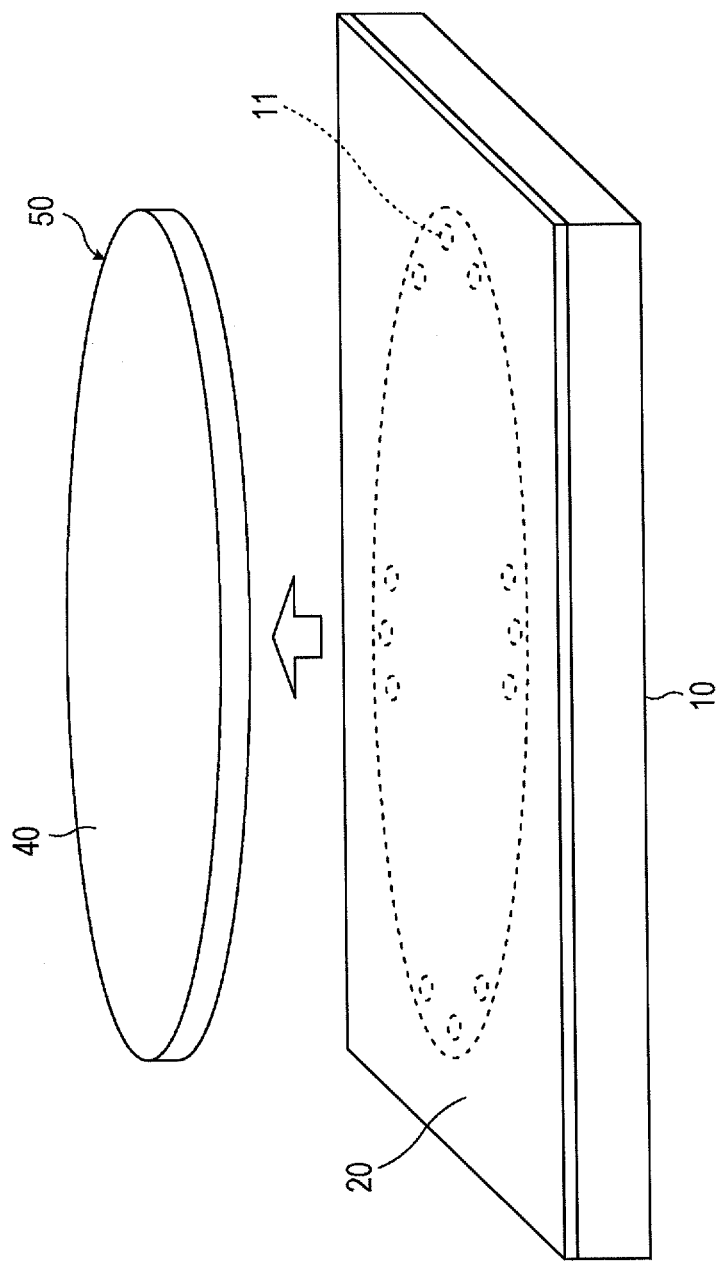

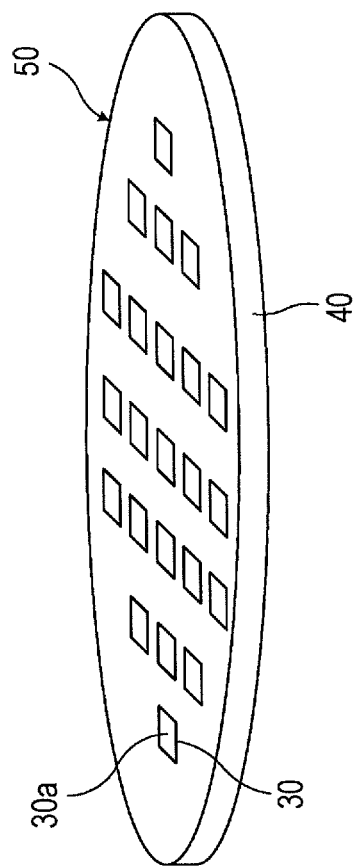

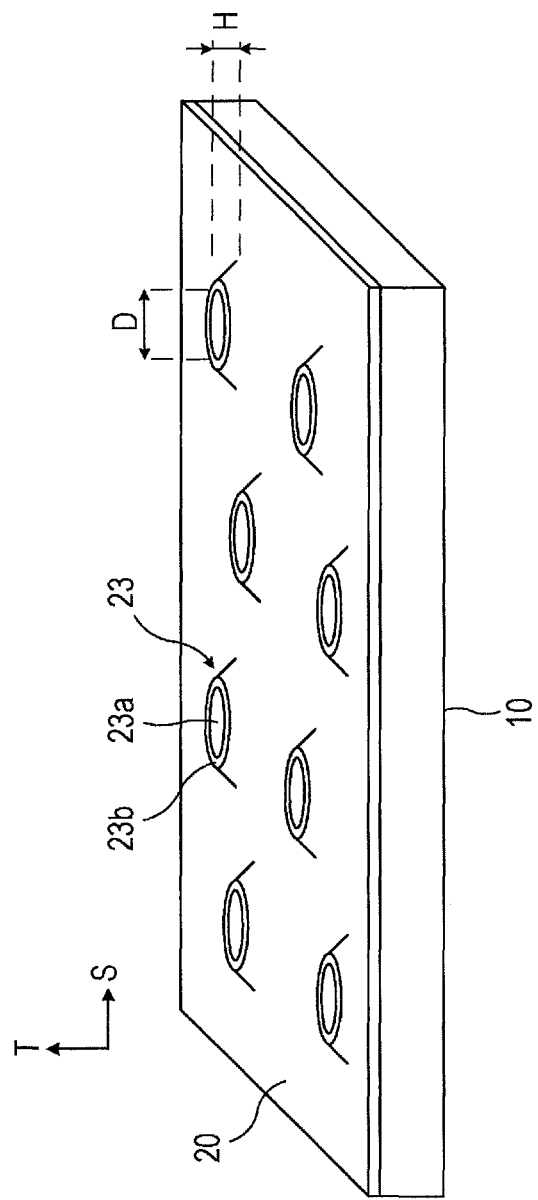

METHOD OF MANUFACTURING SEMICONDUCTOR DEVICE AND METHOD OF MANUFACTURING ELECTRONIC ASSEMBLY

CROSS-REFERENCE TO RELATED APPLICATION(S)

This application is based upon and claims the benefit of priority of the prior Japanese Patent Application No. 2012-031402, filed on Feb. 16, 2012, the entire contents of which are incorporated herein by reference.

FIELD

The embodiment herein is related to a method of manufacturing a semiconductor device and also related to a method of manufacturing an electronic assembly.

BACKGROUND

Wafer-Level Packages (WLPs) are known as an example of semiconductor packages (semiconductor devices) that include semiconductor elements such as bare chips. WLPs are also referred to as Wafer-Level Chip Size Packages (WL-CSPs) or Wafer-Chip Size Packages (W-CSPs). WLPs allow terminals at the ends of a bare chip to be relocated in a chip area, that is, to be fanned-in. WLPs that allow the terminals to be relocated out of the chip area, that is, to be fanned-out, have also been developed in light of a situation in which relocation of the terminals only in the chip area has become difficult because of the increasing number of terminals per bare chip.

In a known technology, such semiconductor packages are manufactured in a method as follows: a semiconductor elements are bonded onto an adhesive layer such as an adhesive sheet provided on a support body, the semiconductor elements are sealed with resin so as to form a dummy wafer, and the dummy wafer is removed from the adhesive layer. In order to remove the dummy wafer from the adhesive layer, the adhesive force of the adhesive layer is decreased by, for example, ultraviolet radiation, chemical treatment, or heat treatment. When the dummy wafer is removed from the adhesive layer, a wiring layer is formed in the dummy wafer, and the dummy wafer is diced into singulated semiconductor packages.

In a known related-art technology for resin sealing using a mold that includes an upper and lower dies, the lower die has irregularities and ejector pins. The irregularities are formed in a surface of the lower die so as to suppress adhesion of a sealed package, and ejector pins are used to remove the package out of the mold.

Examples of related art include the following patent documents:
Description of U.S. Pat. No. 7,202,107B2;
Japanese Patent No. 4403631;
Japanese Laid-open Patent Publication No. 2011-134811; and
Japanese Laid-open Patent Publication No. 2000-133666.

In a technology as described above, in which the dummy wafer (substrate) having been formed on the adhesive layer is removed from the adhesive layer, a technique is usable, in which the adhesive force of the adhesive layer is decreased by ultraviolet radiation, chemical treatment, or heat treatment performed on the adhesive layer.

However, such an adhesive layer, the adhesive force of which is decreased as described above, is difficult to reuse. Thus, the adhesive layer to use is replaced every time a dummy wafer is formed, thereby obstructing reduction in time and cost taken to manufacture semiconductor devices (semiconductor packages). Furthermore, use of thus manufactured semiconductor devices may increase the cost of electronic assemblies.

SUMMARY

According to an aspect of the invention, a method of manufacturing a semiconductor device, includes: providing an adhesive layer on a support body; providing a semiconductor element on the adhesive layer; providing a resin layer on the adhesive layer, the semiconductor element being provided on the adhesive layer, and forming a substrate on the adhesive layer, the substrate including the semiconductor element and the resin layer; and removing the substrate from the adhesive layer, wherein an adhesive force of the adhesive layer in a direction in which the substrate is removed is less than an adhesive force of the adhesive layer in a planar direction in which the substrate is formed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a first explanatory view of a process of manufacturing the semiconductor device;
FIG. 3 is a second explanatory view of the process of manufacturing the semiconductor device;
FIG. 7 is a second view of an example of the structure of the adhesive layer.

DESCRIPTION OF EMBODIMENT

Figure 1A:
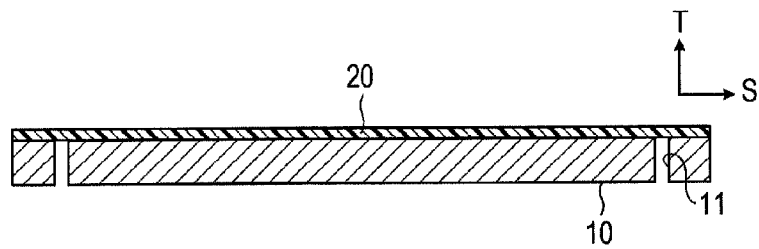
FIGS. 1A to 1E illustrate an example of a method of manufacturing a semiconductor device.
Figure 1B:
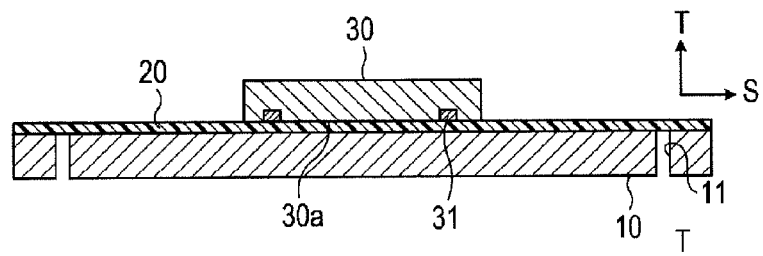
Figure 1C:
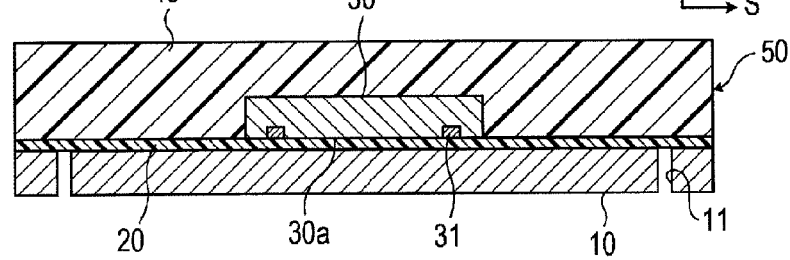
Figure 1D:
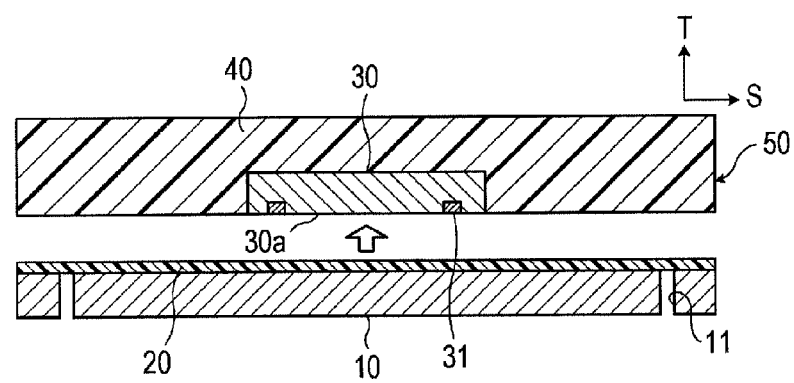

FIGS. 1A to 1E illustrate an example of a method of manufacturing a semiconductor device. Out of FIGS. 1A to 1E, FIG. 1A is a schematic sectional view illustrating a main portion of an example of a process of providing an adhesive layer. FIG. 1B is a schematic sectional view illustrating a main portion of an example of a process of providing a semiconductor element. FIG. 1C is a schematic sectional view illustrating a main portion of an example of a process of providing a resin layer (forming a dummy wafer). FIG. 1D is a schematic sectional view illustrating a main portion of an example of a process of removing the dummy wafer.

Figure 1E:
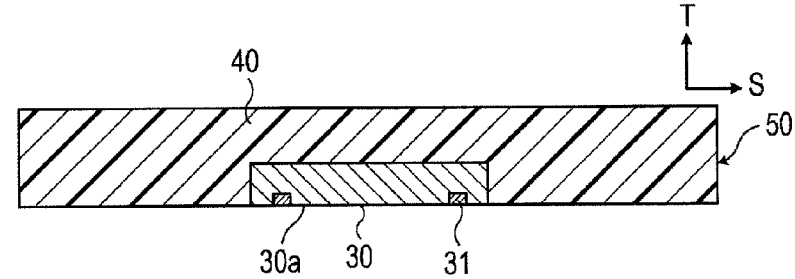

FIG. 1E is a schematic sectional view illustrating a main portion of an example of a process of curing the resin layer. FIGS. 2 and 3 are explanatory views of a process of manufacturing semiconductor device. FIG. 2 is a schematic perspective view of an example of the process of removing the dummy wafer and FIG. 3 is a schematic perspective view of an example of the dummy wafer.

In the manufacture of a semiconductor device, as illustrated in FIG. 1A, an adhesive layer 20 is initially provided on a support body 10. As an example herein, the support body 10 having through holes 11 formed at specified positions therein is used. The through holes 11 are formed so as to apply external forces to a dummy wafer 50, which will be described later, therethrough when the dummy wafer 50 is removed from the adhesive layer 20. The adhesive layer 20 is provided on such a support body 10. The details of the adhesive layer 20 and the like will be described later.

After the adhesive layer 20 has been provided on the support body 10, as illustrated in FIG. 1B, a semiconductor element 30 as an electronic component is provided on the adhesive layer 20, which has been provided on the support body 10, with a surface (electrode surface) 30a where electrodes 31 are provided facing the adhesive layer 20 side. Although a single semiconductor element 30 is illustrated in FIG. 1B, the number of the semiconductor elements 30 provided on the adhesive layer 20 is not limited to one. A plurality of semiconductor elements 30 may be provided on the adhesive layer 20 at respective specified positions with the respective electrode surfaces 30a facing the adhesive layer 20 side in a manner similar to that illustrated in FIG. 1B.

After the semiconductor element 30 has been provided on the adhesive layer 20, a resin layer 40 is provided on the adhesive layer 20 as illustrated in FIG. 1C. The resin layer 40 is provided on the adhesive layer 20 by, for example, molding. Alternatively, the resin layer 40 may be provided on the adhesive layer 20 by pouring resin into a frame that surrounds the semiconductor element 30. The resin layer 40 provided on the adhesive layer 20 is cured by being exposed to heat, ultraviolet radiation, or the like. Thus, the resin layer 40 is provided on the adhesive layer 20, thereby forming the dummy wafer (substrate) 50, which includes the semiconductor element 30 and the resin layer 40 that seals the semiconductor element 30, on the adhesive layer 20.

The resin layer 40 does not have to be completely cured at this stage. As will be described later, it is sufficient that the resin layer 40 be cured to the degree that the dummy wafer 50 having removed from the adhesive layer 20 is allowed to be handled with the state of waver maintained.

The conditions (temperature, ultraviolet radiation, or the like) under which the resin layer 40 is cured at this stage are set in accordance with the properties of the materials of the adhesive layer 20 and the resin layer 40 such that the adhesive force of the adhesive layer 20 is maintained. Alternatively, the material of the adhesive layer 20 is set in accordance with properties of the material of the resin layer 40 and the conditions under which the resin layer 40 is cured.

Next, as illustrated in FIGS. 1D and 2, the dummy wafer 50 formed on the adhesive layer 20 is removed from the adhesive layer 20 and separated from the adhesive layer 20 and the support body 10. In this example, the dummy wafer 50 is removed from the adhesive layer 20 by external forces applied through the through holes 11 formed in the support body 10. For example, members such as pins are inserted into the through holes 11 of the support body 10 toward the adhesive layer 20 side so that the members press the dummy wafer 50 (the dummy wafer 50 is pushed up by the members with the adhesive layer 20 therebetween), thereby to causing the dummy wafer 50 to be removed from the adhesive layer 20. The electrode surface 30a of the semiconductor element 30 is exposed on a surface of the dummy wafer 50 from which the adhesive layer 20 has been removed.

Next, the resin layer 40 of the dummy wafer 50 having been removed from the adhesive layer 20 is further cured by heat, ultraviolet radiation, or the like. Thus, the dummy wafer 50 as illustrated in FIGS. 1E and 3 is formed with the resin layer 40 thereof completely cured. FIG. 3 schematically illustrates the surface side of the dummy wafer 50, the surface being a surface from which the adhesive layer 20 has been removed, in the case where the dummy wafer 50 includes a plurality of semiconductor elements 30 (in the case where the plurality of semiconductor elements 30 are provided on the adhesive layer 20 in the process illustrated in FIG. 1B). In FIG. 3, illustration of the electrodes 31 of each semiconductor element 30 are omitted.

A wiring layer (rewiring layer) is formed in the surface of the dummy wafer 50 formed as described above, the surface being a surface from which the adhesive layer 20 has been removed, that is, the surface on which the electrode surface 30a of the semiconductor element 30 is exposed. The wiring layer includes conducting portions (vias, wiring, and so forth) that are electrically connected to the electrodes 31 of the semiconductor element 30. After the wiring layer is formed, the resin layer 40 and the wiring layer are cut in an area around the semiconductor element 30, thereby singulating semiconductor device (semiconductor package) including the semiconductor element 30.

Next, a method of manufacturing the semiconductor device as described above will be described more in detail.

First, the support body 10, on which the adhesive layer 20 is provided, is described.

The support body 10 may use a substrate made of a material such as metal, glass, a printed board, and ceramic. In order to form the through holes 11 in the support body 10 as described above, the through holes 11 may be formed by etching, punching, drilling, or the like. The method used to form the through holes 11 may be selected corresponding to the material of the support body 10.

Figure 4A:
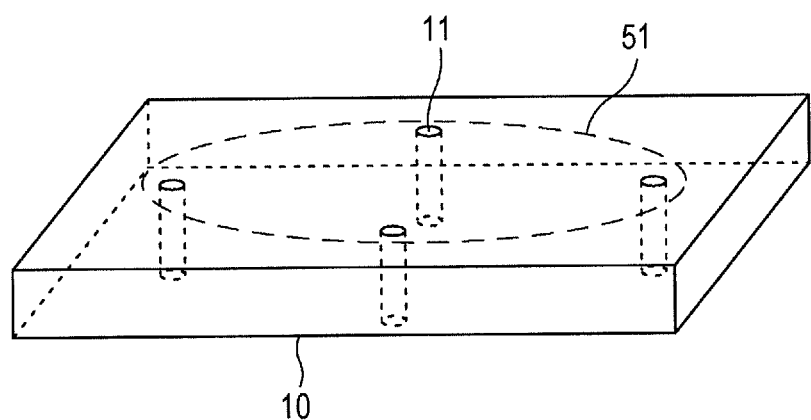
FIGS. 4A and 4B each illustrate an example of the structure of a support body.
Figure 4B:
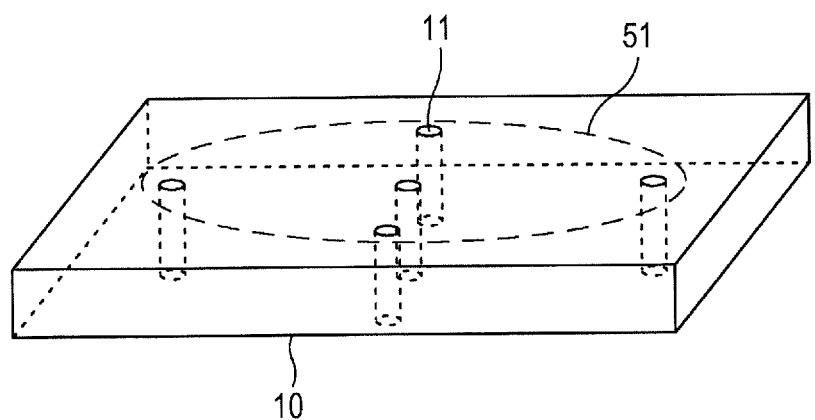

FIGS. 4A and 4B are perspective views of an example of the structure of the support body, the views each illustrating an example of the support body having the through holes.

As described above, the through holes 11 are formed in order to apply external forces to the dummy wafer 50 (pressing with the members such as the pins) when removing the dummy wafer 50 formed on the adhesive layer 20 on the support body 10. The diameter of the through holes 11 is determined so as to allow the members that apply such external forces to be inserted.

As illustrated in FIGS. 4A and 4B, the through holes 11 are formed in a region 51 of the support body 10, the region 51 being a region on which the dummy wafer 50 is formed with the adhesive layer 20 interposed therebetween. The through holes 11 are preferably formed in the region 51 at least at a peripheral portion of the region 51. FIG. 4A illustrates an example in which the through holes 11 are formed at four positions in the peripheral portion of the region 51. FIG. 4B illustrates an example in which the through holes 11 are formed at four positions in the peripheral portion of the region 51 and at a central position of the region 51. With the through holes 11 formed at least in the peripheral portion of the region 51 as described above, removal of the dummy wafer 50, to which external forces are applied through the through holes 11, begins at the peripheral portion. Thus, the dummy wafer 50 is easily removed compared to the case where the through holes 11 are formed, for example, only in the central portion of the region 51.

Furthermore, the through holes 11 are preferably formed in the region 51, on which the dummy wafer 50 is formed, such that the positions of the through holes 11 do not correspond to an area in which the semiconductor element 30 is disposed with the adhesive layer 20 interposed therebetween. In the case where the through holes 11 are formed at positions corresponding to the area in which the semiconductor element 30 is disposed, there is a possibility of the semiconductor element 30 being damaged due increased external force applied to the semiconductor element 30 when the dummy wafer 50 is pressed later by the members such as the pins.

The adhesive layer 20 is provided on the support body 10 in which such through holes 11 having a specified size are formed at a plurality of specified positions.

The number of through holes 11 is not limited to that described in the above-described examples. Also in the above-described examples, the plurality of through holes 11 are formed in the support body 10. Alternatively, the through hole 11 may be formed at a single position of the support body 10 and the dummy wafer 50 may be removed from the adhesive layer 20 by utilizing the through hole 11. When the through hole 11 is thus formed at a single position, the through hole 11 is preferably formed, for example, in the peripheral portion of the region 51 on which the dummy wafer 50 is formed as described above.

Also in the examples described above, the support body 10 having the through holes 11 is prepared and the adhesive layer 20 is provided on the support body 10. Alternatively, through holes that communicate with the through holes 11 of the support body 10 may be formed in the adhesive layer 20.

Figure 5A:
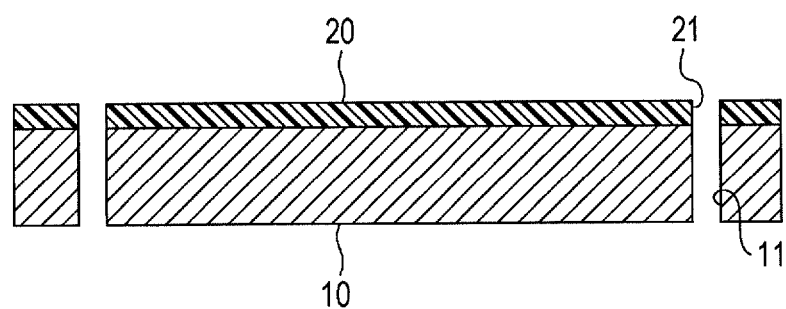
FIGS. 5A and 5B illustrate an example of the structure of the support body and an adhesive layer.
Figure 5B:
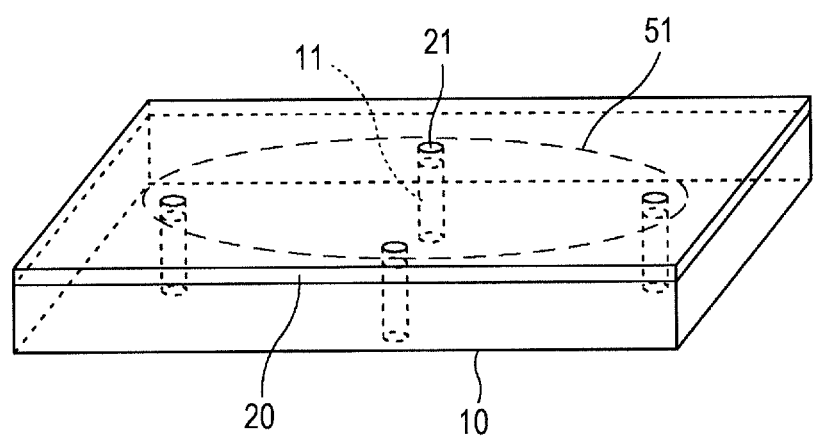

FIGS. 5A and 5B illustrate an example of the structure of the support body and an adhesive layer. FIG. 5A is a schematic sectional view illustrating the example of the support body and the adhesive layer. FIG. 5B is a schematic perspective view illustrating the example of the support body and the adhesive layer.

As illustrated in FIGS. 5A and 5B, the adhesive layer 20 may have through holes 21 formed at positions corresponding to the through holes 11 of the support body 10. By providing the adhesive layer 20, which has such through holes 21, on the support body 10 and by applying external forces to the dummy wafer 50 through the through holes 11 and the through holes 21 communicating with one another, removal of the dummy wafer 50 from the adhesive layer 20 is realized.

A stack of the support body 10 and the adhesive layer 20 as described above is obtained by, for example, providing the adhesive layer 20, portions of which corresponding to the through holes 11 of the support body 10 are hollowed out, on the support body 10 having the through holes 11 while the through holes 11 and the corresponding through holes 21 are aligned with one another. Alternatively, the adhesive layer 20 without the through holes 21 may be provided on the support body 10 without the through holes 11, and the through holes 11 may be formed together with the through holes 21 by punching, drilling, or another method performed on the stack of the support body 10 and the adhesive layer 20.

Next, the adhesive layer 20 provided on the support body 10 is described.

The adhesive layer 20 may be formed of epoxy resin, acrylic resin, polyimide resin, silicone resin, silicon resin, or urethane resin, or a material that includes at least one of these resin materials. The adhesive layer 20 may be provided on the support body 10 by attaching a film (adhesive film) formed of the above-described material onto the support body 10. Alternatively, the adhesive layer 20 may be provided on the support body 10 by applying the above-described material to the support body 10 using spin coating, spray coating, printing, or the like.

The adhesive layer 20 is made to have the following characteristic: in its planar direction (direction S in FIGS. 1A to 1E), the adhesive layer 20 is capable of suppressing misalignment of the semiconductor element 30, which is provided on the adhesive layer 20, with the adhesive layer 20 and allowing the semiconductor element 30 to adhere to the adhesive layer 20 until the dummy wafer 50 is removed; and in a direction in which the dummy wafer 50 is removed (direction T in FIGS. 1A to 1E), the adhesive layer 20 is capable of allowing the dummy wafer 50 to be easily removed. As such, the adhesive layer 20 uses a layer, an adhesive force of which in the direction T, in which the dummy wafer 50 is removed, is less than that in the planar direction S, in which the dummy wafer 50 is formed.

With such an adhesive layer 20, misalignment of the semiconductor element 30 in the S direction is suppressed from a time when the semiconductor element 30 and the resin layer 40 are provided on the adhesive layer 20 so as to form the dummy wafer 50 to a time when the dummy wafer 50 is removed from the adhesive layer 20 (FIGS. 1B to 1D).

When the dummy wafer 50 is formed on the adhesive layer 20, for example, curing the resin layer 40 provided so as to seal the semiconductor element 30 may cause the resin layer 40 to contract. If misalignment in the direction S of the semiconductor element 30 is caused by such contraction of the resin layer 40 due to curing of the resin layer 40, electrical connection between the wiring and vias of the wiring layer and the semiconductor element 30 may become defective when the wiring layer is formed later on the dummy wafer 50. Furthermore, in some case, taking, for example, the following measures is desirable: changes in the conditions under which the wiring and vias are formed in accordance with misalignment of the semiconductor element 30, for example, the conditions for patterning and masks to be used to form the wiring and vias using the photolithography technique.

In contrast, by using the adhesive layer 20 as described above, even if the resin layer 40 contracts due to curing of the resin layer 40, misalignment of the semiconductor element 30 in the direction S on the adhesive layer 20 may be effectively suppressed. This allows the wiring layer to be precisely formed later under certain conditions.

The adhesive layer 20 has a characteristic in which the adhesive force thereof in the direction T, in which the dummy wafer 50 is removed, is less than that in the direction S. This allows the dummy wafer 50 to be easily removed from the adhesive layer 20 after the dummy wafer 50 has been formed by providing the semiconductor element 30 and the resin layer 40 on the adhesive layer 20. When the dummy wafer 50 is removed, application of large external forces is not necessarily desired. Even with comparatively small external forces, a gap may be formed between the dummy wafer 50 and the adhesive layer 20, and the dummy wafer 50 may be easily removed from the adhesive layer 20 starting from the gap.

As an example of techniques used to remove a dummy wafer having been formed on an adhesive layer from the adhesive layer, there exists a technique in which the adhesive force of the adhesive layer is decreased by ultraviolet radiation, chemical treatment, heat treatment, or the like performed on the adhesive layer so as to remove the dummy wafer. However, reuse of the adhesive layer becomes difficult after the adhesive force of the adhesive layer have been decreased by ultraviolet radiation, chemical treatment, heat treatment, or the like, as described above. For this reason, when this technique is used, the adhesive layer, which has been used and the adhesive force of which has been decreased, is discarded, and the adhesive layer is replaced with a new adhesive layer every time a dummy wafer is formed. The fact that the adhesive layer is not repeatedly usable as described above causes the cost of the dummy wafer to be increased, and accordingly, causes the cost of a semiconductor package, which is formed of the dummy wafer, to be increased.

In contrast, the above-described adhesive layer 20 has a characteristic in which the adhesive force in the direction T, in which the dummy wafer 50 is removed, is comparatively small. This allows the dummy wafer 50 to be removed from the adhesive layer 20 without performing ultraviolet radiation, chemical treatment, heat treatment, or other treatment that decreases the adhesive force of the adhesive layer 20.

Since the adhesive layer 20 does not undergo treatment that decreases its adhesive force, the adhesive layer 20 may be reused when another dummy wafer 50 is newly formed. That is, as illustrated in FIGS. 1A to 1D, the semiconductor element 30 is initially provided on the adhesive layer 20 on the support body 10, the resin layer 40 is provided so as to form a first dummy wafer 50, and the first dummy wafer 50 having been formed is removed from the adhesive layer 20. After that, another semiconductor element 30 is provided on the adhesive layer 20, from which the first dummy wafer 50 has been removed, and another resin layer 40 is provided so as to form a second dummy wafer 50. The adhesive layer 20, from which the second dummy wafer 50 has been removed, may be used to form a third dummy wafer 50 in a similar manner.

Thus, the adhesive force of the adhesive layer 20 in the direction T, in which the dummy wafer 50 is removed, is made to be less than that in the planar direction S, in which the dummy wafer 50 is formed. This allows the dummy wafer 50 to be removed from the adhesive layer 20 without performing ultraviolet radiation, chemical treatment, heat treatment, or other treatment that decreases the adhesive force of the adhesive layer 20. Thus, the adhesive layer 20 may be reused. As a result, time to replace the adhesive layer 20 on the support body 10 every time the dummy wafer 50 is formed may be decreased, and cost reduction of the dummy wafer 50 and the semiconductor package may be realized.

The adhesive layer 20 as described above is a layer, the adhesive force of which in the direction T, in which the dummy wafer 50 is removed, is less than that in the planar direction S, in which the dummy wafer 50 is formed. As such an adhesive layer 20, structures as illustrated in FIGS. 6 and 7, which are described below, may be used.

Figure 6:
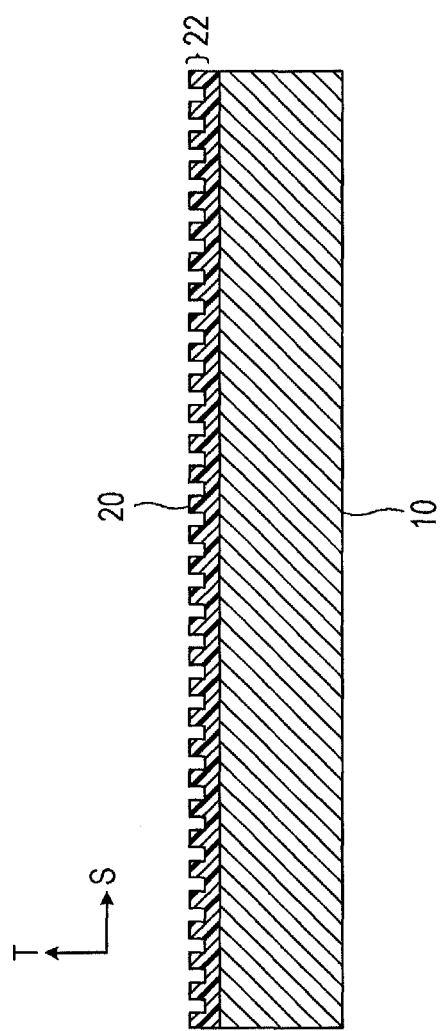
FIG. 6 is a first view of an example of the structure of the adhesive layer.

FIGS. 6 and 7 each illustrate an example of the structure of the adhesive layer. FIG. 6 is a schematic sectional view of a main portion of an example of the adhesive layer, and FIG. 7 is a schematic perspective view of a main portion of another example the adhesive layer.

Here, for example as illustrated in FIG. 6, irregularities 22 are formed on the surface of the adhesive layer 20, on which the semiconductor element 30 and the resin layer 40 are provided so as to form the dummy wafer 50. As arrangement of the irregularities 22, for example, protrusions of the irregularities 22 may be scattered, the protrusions may be arranged along lines parallel to one another, or protrusions may be arranged along parallel lines in the length and width directions so as to form a grid shape.

Alternatively, the adhesive layer 20 has, for example, as illustrated in FIG. 7, a plurality of crater-shaped irregularities 23 in the surface thereof, the surface being a surface on which the dummy wafer 50 is formed. The crater-shaped irregularities 23 has recesses 23a, each of which is recessed in a crater shape, and protrusions 23b, each of which surrounds a corresponding one of the recesses 23a. For convenience of description, one recess 23a is surrounded by the ring-shaped protrusion 23b in FIG. 7. However, the protrusion 23b is not necessarily has a ring shape.

By using the adhesive layer 20 having such irregularities 22 or 23, misalignment of the semiconductor element 30, which is provided on the adhesive layer 20, in the direction S is suppressed, and the dummy wafer 50 formed on the adhesive layer 20 is easily removed.

In order to realize such characteristics, the diameter D of the protrusions 23b, which surround the respective recesses 23a recessed in a crater-shape in the crater-shaped irregularities 23, is preferably set in a range, for example, from 0.1 to 10 μm. The height H of the protrusions 23b is preferably set in a range from 0.2 to 1000 nm. In order to form such irregularities 23, techniques such as nanoimprinting, plasma treatment, dry etching, and wet etching may be used.

FIGS. 8A to 9B illustrate examples of methods of forming the adhesive layer. In particular, FIGS. 8A to 9B illustrate schematic sectional views of main portions of processes of forming irregularities of the adhesive layer.

Figure 8A:
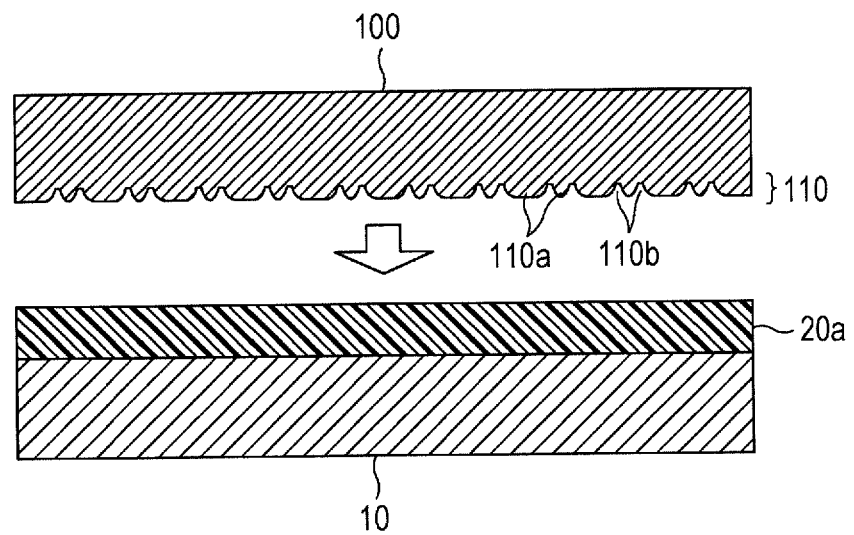
FIGS. 8A and 8B are first views of an example of a method of forming the adhesive layer.
Figure 8B:
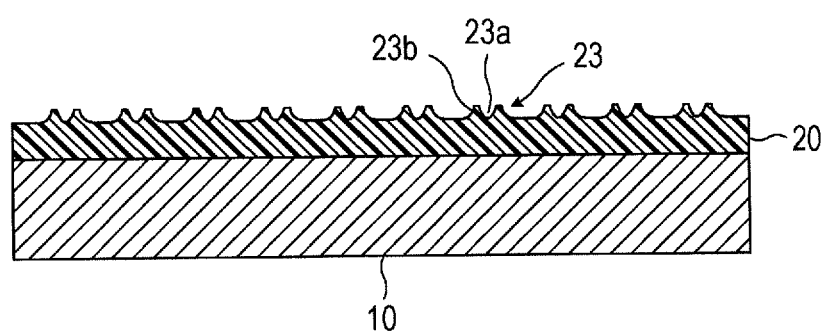

When the crater-shaped irregularities 23 of the adhesive layer 20 are formed by, for example, nanoimprinting, as illustrated in FIG. 8A, a mold 100 provided with irregularities 110, which correspond to the irregularities 23 of the adhesive layer 20, is prepared. That is, the mold 100 that has protrusions 110a provided corresponding to the recesses 23a of the adhesive layer 20 and recesses 110b provided corresponding to the protrusions 23b of the adhesive layer 20 is prepared. The above-described mold 100 is pressed against a layer 20a, which is provided on the support body 10, formed of a specified material that exhibits adhesive properties used for the adhesive layer 20. By doing this, the adhesive layer 20, which has the recesses 23a and the protrusions 23b respectively corresponding to the protrusions 110a and the recesses 110b of the mold 100 as illustrated in FIG. 8B, is obtained.

Figure 9A:
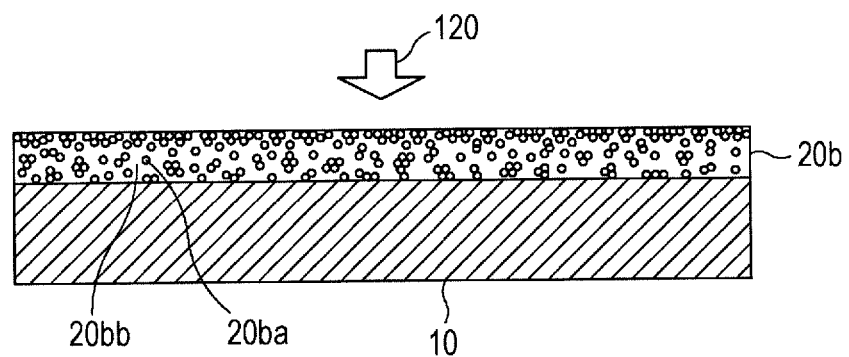
FIGS. 9A and 9B are second views of an example of the method of forming the adhesive layer.
Figure 9B:
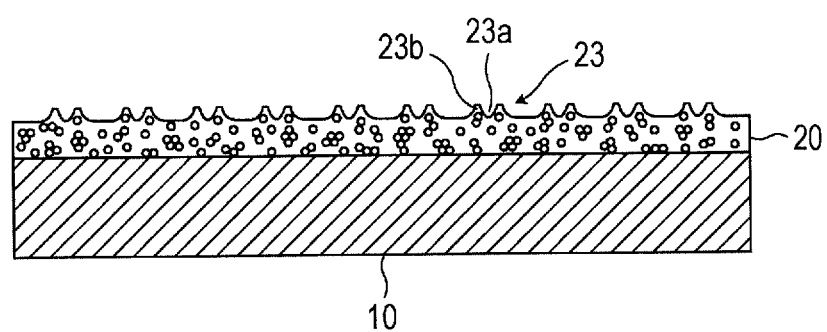

Alternatively, there is another method in which the crater-shaped irregularities 23 of the adhesive layer 20 are formed by utilizing plasma treatment as illustrated in FIG. 9. In this method, a layer 20b as illustrated in FIG. 9A is formed by, for example, providing a mixture on the support body 10. The mixture is made by mixing an acrylic resin filler 20ba made of particles having an average particle size of 100 to 500 nm with a matrix material 20bb containing polyimide resin or epoxy resin that exhibits adhesive properties. A surface of the layer 20b is subjected to treatment using, for example, oxygen plasma 120. At this time, since the etching rate for the acrylic resin filler 20ba is higher than that for the matrix material 20bb containing epoxy resin or polyimide resin, the particles of the acrylic resin filler 20ba on the surface of the layer 20b are selectively removed. As a result, as illustrated in FIG. 9B, the recesses 23a are formed in portions where the particles of the acrylic resin filler 20ba have been selectively removed. Thus, the adhesive layer 20 having the crater-shaped irregularities 23 formed therein is obtained.

The combination of materials usable for forming the adhesive layer 20 in the method as illustrated in FIGS. 9A and 9B is not limited to the above-described example. As an example in the above description, the irregularities 23 are formed by using plasma treatment. Alternatively, the irregularities 23 may be formed by selective etching using dry etching or wet etching instead of plasma treatment.

With the adhesive layer 20 as described above, the adhesive force in the direction T, in which the dummy wafer 50 is removed, may be set to equal to or less than 400 gf/cm. Also, the adhesive force in the planar direction S, in which the dummy wafer 50 is formed, may be equal to or greater than 1 kgf/cm$^2$ (a silicon chip cut into length of 5 mm, width of 5 mm, and thickness of 0.5 mm is disposed on the adhesive layer 20 and the adhesive force in the planar direction S is measured with a die shear tester).

Next, the semiconductor element 30 and the resin layer 40 provided on the adhesive layer 20 are described.

The semiconductor element 30 may use a bare chip such as a large scale integration (LSI). The thickness of the semiconductor element 30 to be used is, for example, from 0.1 to 0.7 mm.

The resin layer 40 is used for sealing the semiconductor element 30 and may use one of a variety of electrically non-conductive sealing resin materials. The resin layer 40 may include electrically non-conductive fillers. By using the adhesive layer 20 as described above, misalignment of the semiconductor element 30 in the planar direction S of the adhesive layer 20 may be effectively suppressed, even when such a resin layer 40 is provided and cured so as to form the dummy wafer 50. The thickness of the resin layer 40 provided on the adhesive layer 20 is set such that, for example, the resin layer 40 is formed up to a level further from the adhesive layer 20 than the upper surface of the semiconductor element 30 provided on the adhesive layer 20 by, for example, equal to or larger than 0.1 mm.

Alternatively, the thickness of the resin layer 40 of the dummy wafer 50 may be the same or substantially the same as that of the semiconductor element 30, that is, a surface of the semiconductor element 30 on the side opposite to the electrode surface 30a side (rear surface) may be exposed from the resin layer 40. In this case, the resin layer 40 may be initially provided on the adhesive layer 20 on the support body 10 so that the semiconductor element 30 is covered so as to form the dummy wafer 50, and after that, the resin layer 40 may be polished or ground, so that the rear surface of the semiconductor element 30 is exposed.

Next, formation of the wiring layer and singulation is described.

After removing the dummy wafer 50 from the adhesive layer 20 and the resin layer 40 of the dummy wafer 50 is further cured, the wiring layer is formed in the surface of the dummy wafer 50, the surface being a surface from which the adhesive layer 20 has been removed (the surface on which the electrode surface 30a of the semiconductor element 30 is exposed). The wiring layer may be formed by using the following method.

A photosensitive resin such as, for example, photosensitive epoxy, photosensitive polybenzoxazole or photosensitive polyimide is initially applied onto the surface of the dummy wafer 50, the surface being a surface from which the adhesive layer 20 has been removed. After that, radiation, developing and curing is performed, thereby forming openings that extend to the electrodes 31 of the electrode surface 30a of the semiconductor element 30. After curing, plasma treatment may be performed. Next, a metal contact layer is formed of titanium, chrome, or the like, and a seed layer is formed of copper by sputtering. After that, a photoresist of a pattern, portions of which where vias or wiring is formed are open, is formed, and copper is electroplated using the seed layer having been formed. After the photoresist has been removed, the seed layer remaining in areas where the photoresist has been formed is removed. The seed layer may be removed by wet etching or dry etching. After the seed layer has been removed, the surface treatment may be performed on wiring in order to improve the degree of contact and the like. The wiring layer has been formed through the processes as described above.

In the case where multilayer wiring is formed with the above-described wiring layer as a first wiring layer, in order to form a second wiring layer and after, the processes from application of the photosensitive resin as described above are repeatedly performed in a similar manner to form wiring layers, thereby forming the multilayer wiring.

A protective film such as a solder resist or the like is formed on a top most wiring layer such that part of the wiring is exposed from the protective film. Wiring areas exposed from the protective film are utilized for external connection terminals. Surface treatment may be performed on the wiring areas exposed from the protective film by coating with nickel and then coating with gold. Bumps such as solder balls may be mounted on the wiring areas exposed from the protective film, or the wiring areas on which the surface-treatment with nickel and gold has been performed.

After the wiring layer has been thus formed, by cutting the resin layer 40 and the wiring layer in an area around the semiconductor element 30 so as to cingulate the semiconductor element 30, the semiconductor device (semiconductor package) including the semiconductor element 30 is obtained.

In the example method in the above description, the dummy wafer 50 is removed from the adhesive layer 20 by applying external forces to the dummy wafer 50, which is formed on the adhesive layer 20 on the support body 10, through the through holes 11, which is formed in the support body 10. Despite this, when the adhesive layer 20 as described above is used, such through holes 11 does not have to be formed in the support body 10.

Figure 10A:
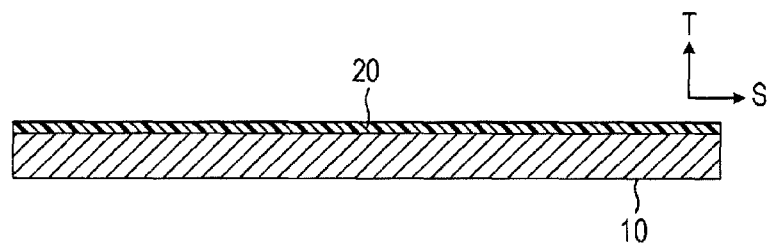
FIGS. 10A to 10E illustrate another example of the method of manufacturing the semiconductor device.
Figure 10B:
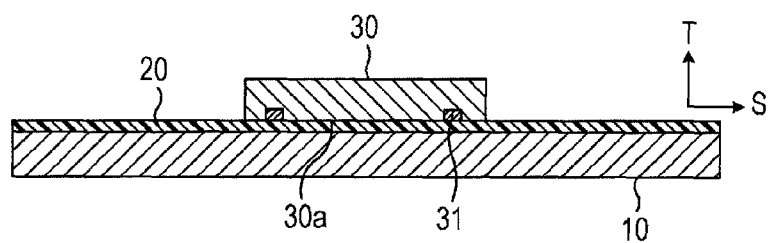
Figure 10C:
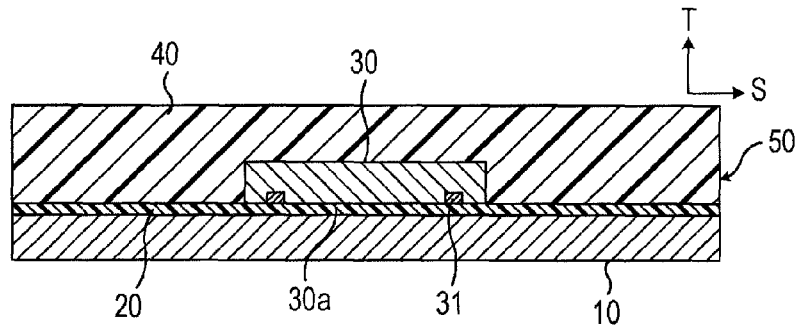
Figure 10D:
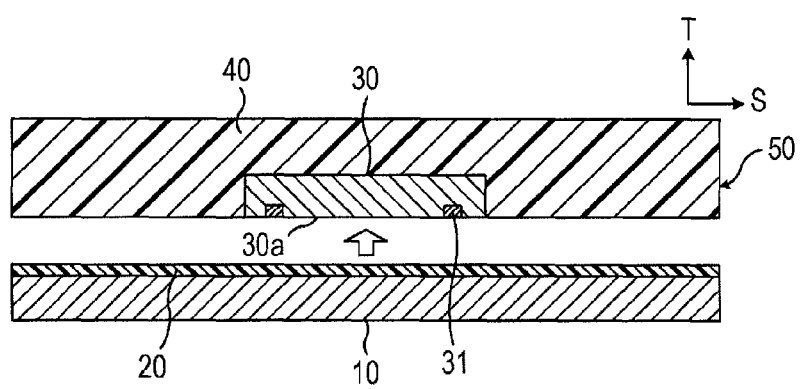
Figure 10E:
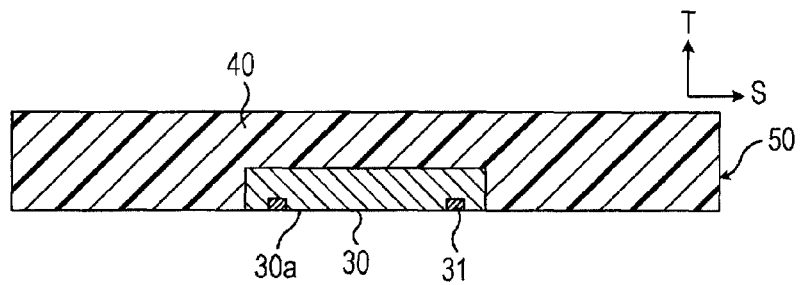

FIGS. 10A to 10E illustrate another example of a method of manufacturing the semiconductor device. Out of FIGS. 10A to 10E, FIG. 10A is a schematic sectional view illustrating an example of a process of providing the adhesive layer. FIG. 10B is a schematic sectional view illustrating a main portion of an example of a process of providing the semiconductor element. FIG. 10C is a schematic sectional view illustrating a main portion of an example of a process of providing the resin layer. FIG. 10D is a schematic sectional view illustrating a main portion of an example of a process of removing the adhesive layer. FIG. 10E is a schematic sectional view illustrating a main portion of an example of a process of curing the resin layer.

In the method illustrated in FIGS. 10A to 10E, the support body 10, in which the through holes 11 has not been formed, is used. As illustrated in FIG. 10A, the adhesive layer 20 is provided on such a support body 10, and as illustrated in FIG. 10B, the semiconductor element 30 is provided with the electrode surface 30a facing the adhesive layer 20 side. As illustrated in FIG. 10C, the resin layer 40 is provided and cured so as to form the dummy wafer 50. This dummy wafer 50 is removed from the adhesive layer 20 as illustrated in FIG. 10D, and as illustrated in FIG. 10E, the resin layer 40 is further cured.

Here, the adhesive force of the adhesive layer 20 in the planar direction S is comparatively large and the adhesive force of the adhesive layer 20 in the direction T, in which the dummy wafer 50 is removed, is comparatively small. This allows the dummy wafer 50 to be removed from the adhesive layer 20 without applying external forces through the through holes 11 or decreasing the adhesive force of the adhesive layer 20 by performing ultraviolet radiation, chemical treatment, heat treatment, or the like as described above.

The adhesive layer 20 is reusable also in the case where the method as illustrated in FIGS. 10A to 10E are used. That is, after the dummy wafer 50 has been formed as illustrated in FIGS. 10A to 10C and the dummy wafer 50 has been removed from the adhesive layer 20 as illustrated in FIG. 10D, another dummy wafer 50 may be newly formed on the adhesive layer 20 by performing the processes as illustrated in FIGS. 10B and 10C again.

In the example described above, the semiconductor element 30 is described as the example of the electronic component provided on the adhesive layer 20. In addition to such a semiconductor element 30, a chip capacitor and other electronic components may be provided on the adhesive layer 20. An example of a method of manufacturing a semiconductor device that includes chip capacitors and other electronic components in addition to the semiconductor elements 30 are described below with reference to FIGS. 11 to 17E.

Figure 11:
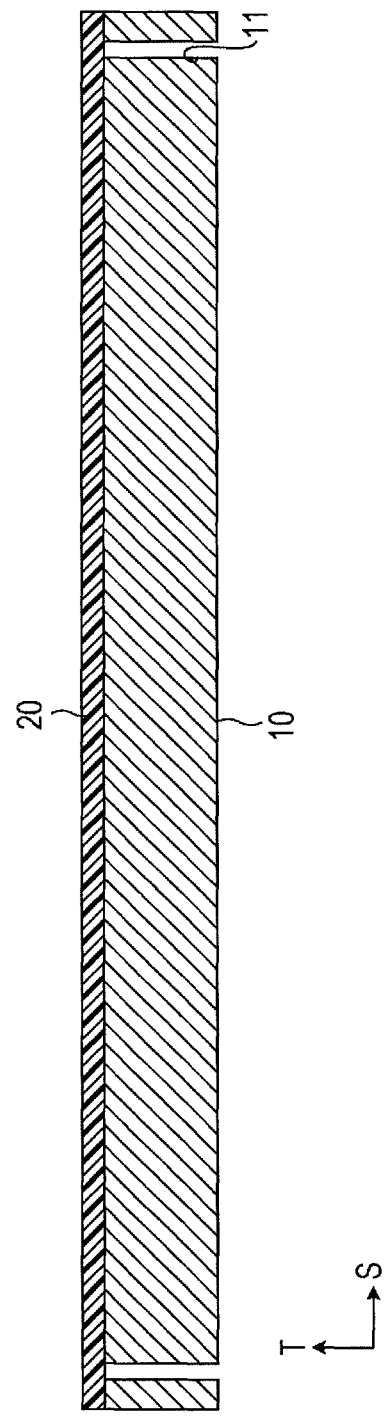
FIG. 11 is a first view of an example of a process of manufacturing the semiconductor device.
Figure 12:
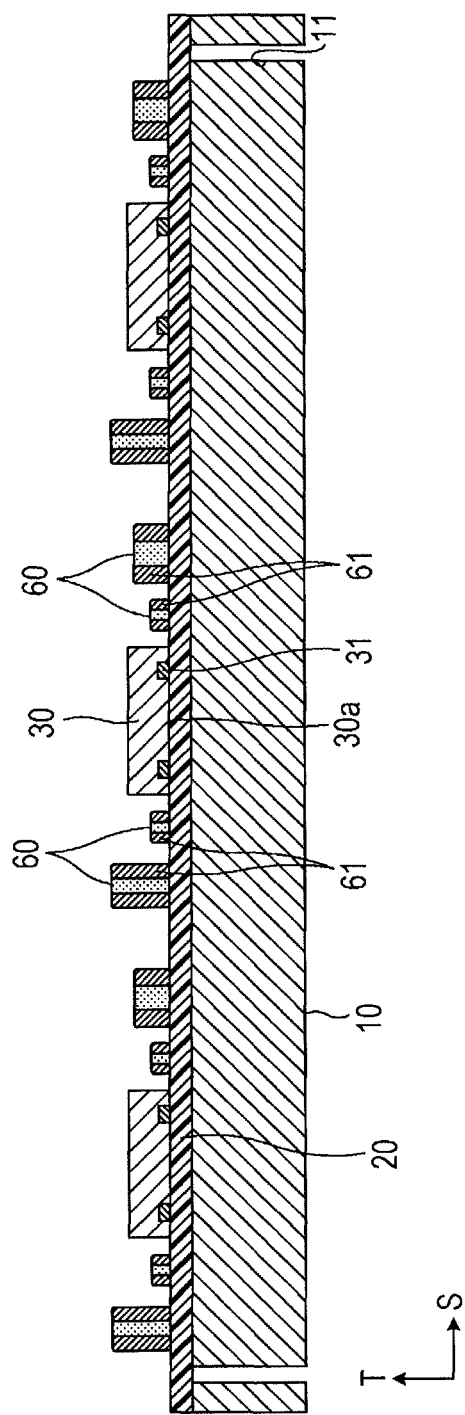
FIG. 12 is a second view of an example of a process of manufacturing the semiconductor device.
Figure 13:
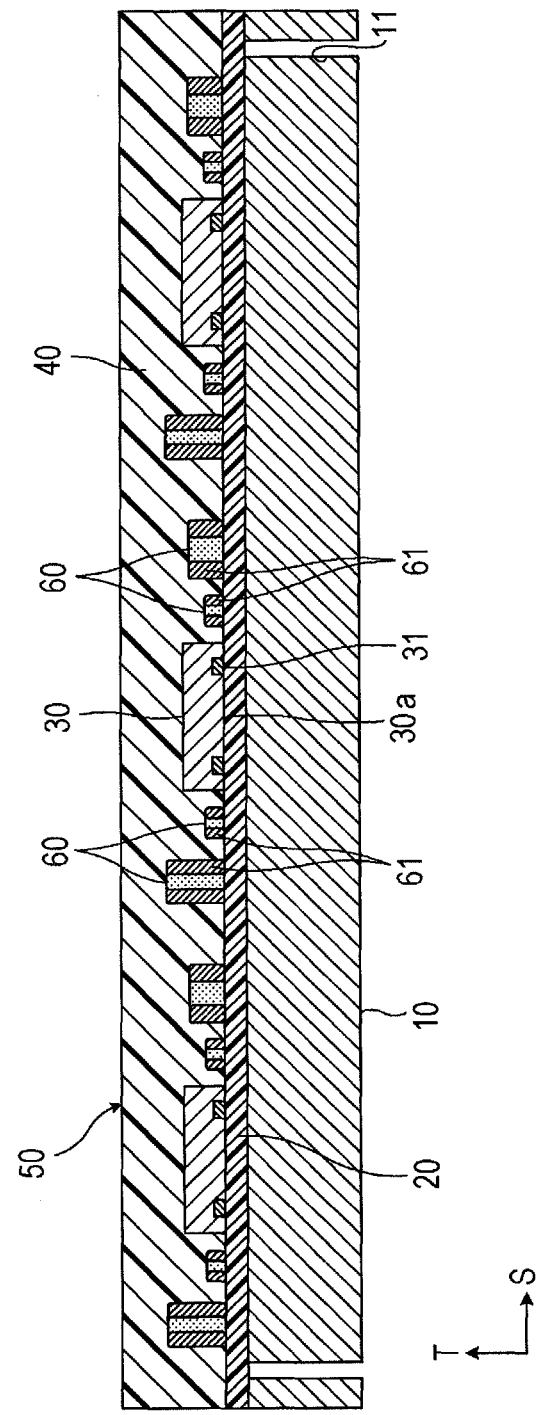
FIG. 13 is a third view of an example of a process of manufacturing the semiconductor device.
Figure 14:
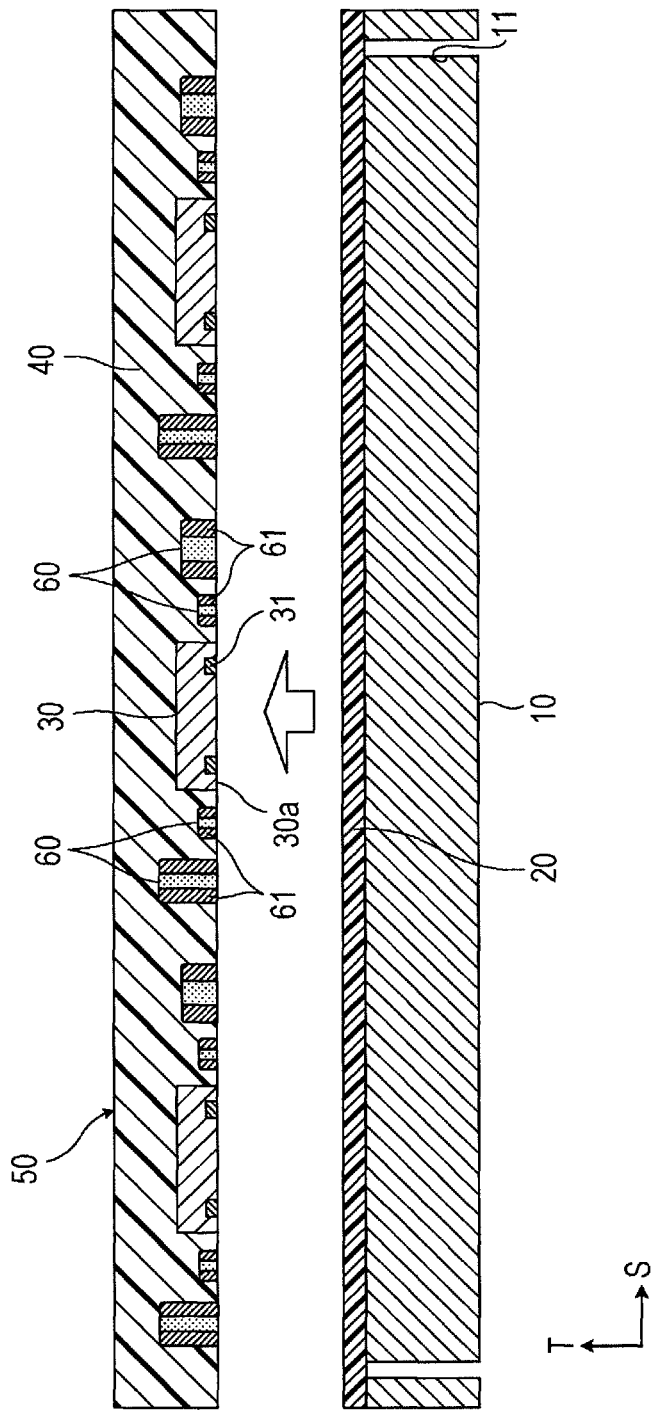
FIG. 14 is a fourth view of an example of a process of manufacturing the semiconductor device.
Figure 15:
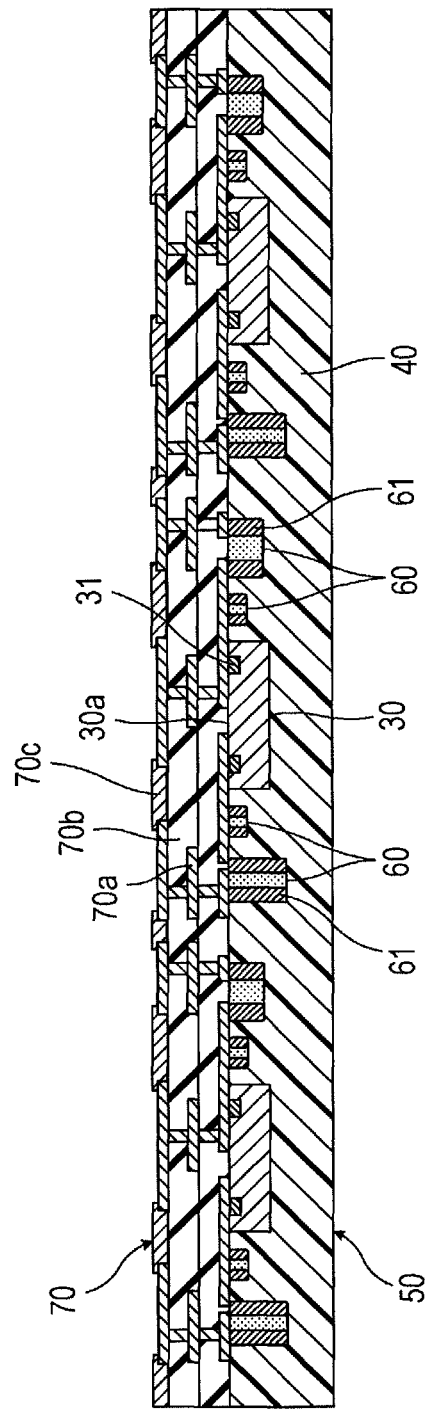
FIG. 15 is a fifth view of an example of a process of manufacturing the semiconductor device.
Figure 16:
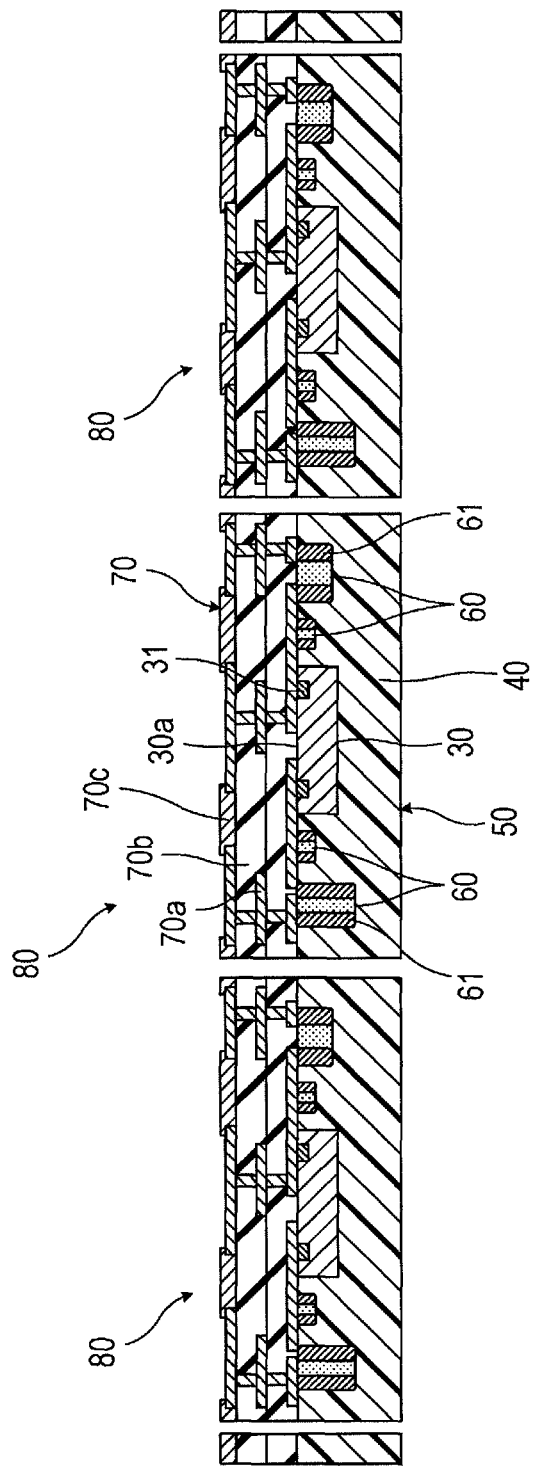
FIG. 16 is a sixth view of an example of a process of manufacturing the semiconductor device.

FIGS. 11 to 17E illustrate an example of a method of manufacturing the semiconductor device. FIG. 11 is a schematic sectional view illustrating a main portion of an example of a process of providing the adhesive layer. FIG. 12 is a schematic sectional view illustrating a main portion of an example of a process of providing the electronic components. FIG. 13 is a schematic sectional view illustrating a main portion of an example of a process of providing the resin layer (forming the dummy wafer). FIG. 14 is a schematic sectional view illustrating a main portion of an example of a process of removing the dummy wafer. FIG. 15 is a schematic sectional view illustrating a main portion of an example of a process of forming the wiring layer. FIG. 16 is a schematic sectional view illustrating a main portion of an example of a singulation process. FIGS. 17A to 17E are explanatory views of a process of forming the wiring layer.

As illustrated in FIG. 11, the adhesive layer 20 exhibiting the adhesive forces in the directions S and T as described above is initially provided on the support body 10 having the through holes 11. Next, as illustrated in FIG. 12, the semiconductor elements 30 and chip components 60 such as chip capacitors are provided in specified areas on the adhesive layer 20. Specifically, the electrodes 31 of the electrode surfaces 30a of the semiconductor elements 30 are bonded to the adhesive layer 20, and electrodes 61 of the chip components 60 are bonded to the adhesive layer 20. Next, as illustrated in FIG. 13, the resin layer 40 is provided on the adhesive layer 20, on which the semiconductor elements 30 and the chip components 60 are provided, and the resin layer 40 is cured so as to form the dummy wafer 50. Next, external forces are applied to the dummy wafer 50 through the through holes 11 of the support body 10, thereby removing the dummy wafer 50 from the adhesive layer 20 as illustrated in FIG. 14. After that, the resin layer 40 is further cured.

Thus, a wiring layer 70 as illustrated in FIG. 15 is formed in a surface of the dummy wafer 50 having been removed from the support body 10 and the adhesive layer 20, the surface being on a side on which the electrodes 31 of the semiconductor elements 30 and the electrodes 61 of the chip components 60 are exposed. The wiring layer 70 includes electrically conductive portions 70a and insulation portions 70b. The electrically conductive portions 70a include vias, wiring, and the like, which are electrically connected to the electrodes 31 of the semiconductor elements 30 and the electrodes 61 of the chip components 60. The insulation portions 70b are provided around the electrically conductive portions 70a. Furthermore, a protective film 70c such as a solder resist is provided on a surface of the wiring layer 70.

Such a wiring layer 70 may be formed by the processes, for example, as illustrated in FIG. 17. Here, a method of forming the wiring layer 70 is described using an example in which one of the electrically conductive portions 70a is electrically connected to a corresponding one of the electrodes 31 of the semiconductor element 30.

Figure 17A:
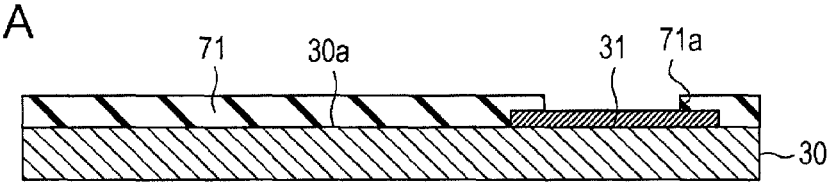
FIGS. 17A to 17E are seventh views of an example of a processes of manufacturing the semiconductor device.

As illustrated in FIG. 17A, a photosensitive resin 71 (70b) such as photosensitive polybenzoxazole is initially applied onto the electrode surface 30a side of the semiconductor element 30 of the dummy wafer 50, and radiation, developing and curing is performed, thereby forming an opening 71a that extends to the electrode 31 of the semiconductor element 30. After curing, plasma treatment may be performed.

Figure 17B:
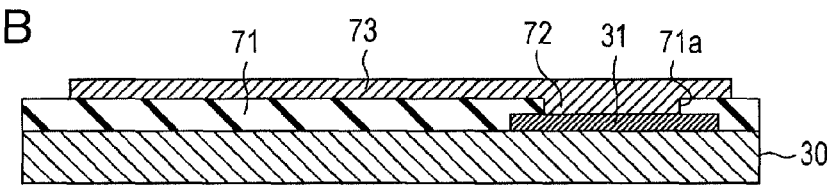

Next, a metal contact layer is formed of titanium, chrome, or the like, and a seed layer is formed of copper by sputtering. After that, a photoresist (not illustrated) of a pattern, portions of which where vias or wiring is formed are open, is formed, and copper is electroplated using the seed layer having been formed. After the photoresist has been removed, the seed layer remaining in areas where the photoresist is formed is removed by etching. Thus, a via 72 and wiring 73 (70a) as illustrated in FIG. 17B connected to the electrodes 31 of the semiconductor element 30 has been formed. Surface treatment may be performed on the wiring 73 in order to improve the degree of contact and the like. With the method illustrated in FIGS. 17A and 17B, the first wiring layer is formed.

Figure 17C:
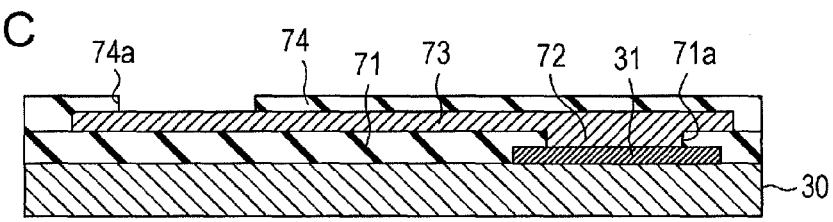
Figure 17D:
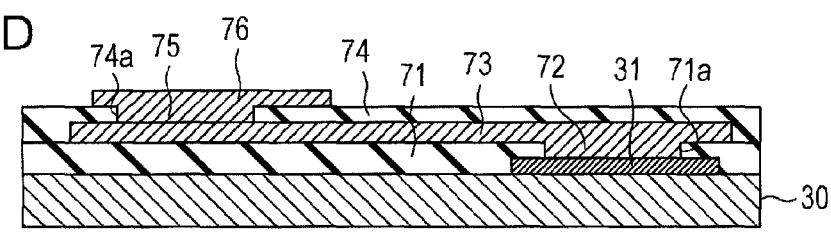

In the case where the second wiring layer is formed as is the case with this example, as described above, a photosensitive resin 74 (70b) is applied onto the first wiring layer, and radiation, developing and curing is performed, thereby forming an opening 74a that extends to the wiring 73 as illustrated in FIG. 17C. Next, as is the case with the above description, formation of the seed layer, formation of the photoresist, electroplating of copper, removal of the photoresist, and etching of the seed layer are performed. Thus, a via 75 and wiring 76 (70a) as illustrated in FIG. 17D is formed. With the method illustrated in FIGS. 17C and 17D, the second wiring layer is formed.

Figure 17E:
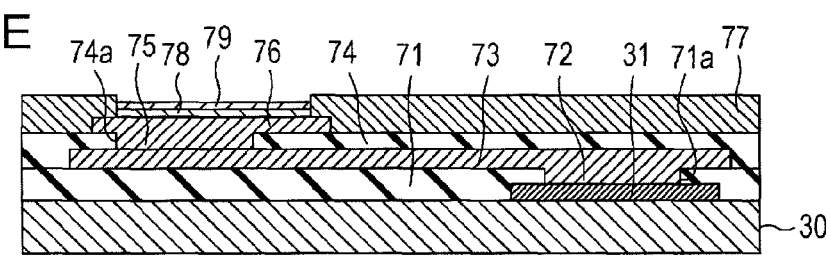

As illustrated in FIG. 17E, a solder resist 77 (70c) is formed on a top most wiring layer (second wiring layer in this example) of the thus formed wiring layer 70 (multilayer wiring) such that part of the wiring 76 (external connection terminal) is exposed. Surface treatment is performed on the area of the wiring 76 exposed from the solder resist 77 using, for example, nickel 78 and gold 79. For example, a bump such as a solder ball is mounted on the area of the wiring 76 that functions as the external connection terminal (in the case where surface treatment with the nickel 78 and the gold 79 are performed, the treated surface).

With reference to FIGS. 17A to 17E, the process of forming the wiring layer 70 has been described with the electrically conductive portions 70a (via 72 and wiring 73; via 75 and wiring 76), which are electrically connected to the electrode 31 of the semiconductor element 30, as an example. In the wiring layer 70, the electrically conductive portions 70a (vias and wiring) electrically connected to the electrodes 61 of the chip components 60 are formed together with the electrically conductive portions 70a electrically connected to the electrode 31 of the semiconductor element 30 described with reference to FIGS. 17A to 17E.

After the wiring layer 70 is formed by performing the processes as illustrated in FIGS. 15 and 17A to 17E, as illustrated in FIG. 16, the dummy wafer 50 and the wiring layer 70 are cut at specified positions by dicing or another method. By doing this, singulated individual semiconductor devices 80 each including the semiconductor element 30 and the chip components 60 are obtained.

In such a method of manufacturing the semiconductor device 80, the adhesive layer 20 uses a layer, the adhesive force of which in the direction T, in which the dummy wafer 50 is removed, is less than that in the planar direction S, in which the dummy wafer 50 is formed. For this reason, when the dummy wafer 50 is removed from the adhesive layer 20, ultraviolet radiation, chemical treatment, heat treatment, or other treatment that decreases the adhesive force of the adhesive layer 20 may be omitted. Accordingly, the adhesive layer 20 is reusable. For example, the support body 10 and the adhesive layer 20 once removed from the dummy wafer 50 in the process illustrated in FIG. 14 is reusable when a new dummy wafer 50 is formed.

Use of the above-described adhesive layer 20 allows time and the cost taken to manufacture the semiconductor device 80 to be reduced, and accordingly, the cost of the semiconductor device 80 may be reduced.

The semiconductor device 80 obtained as described above may be mounted on a circuit substrate.

Figure 18:
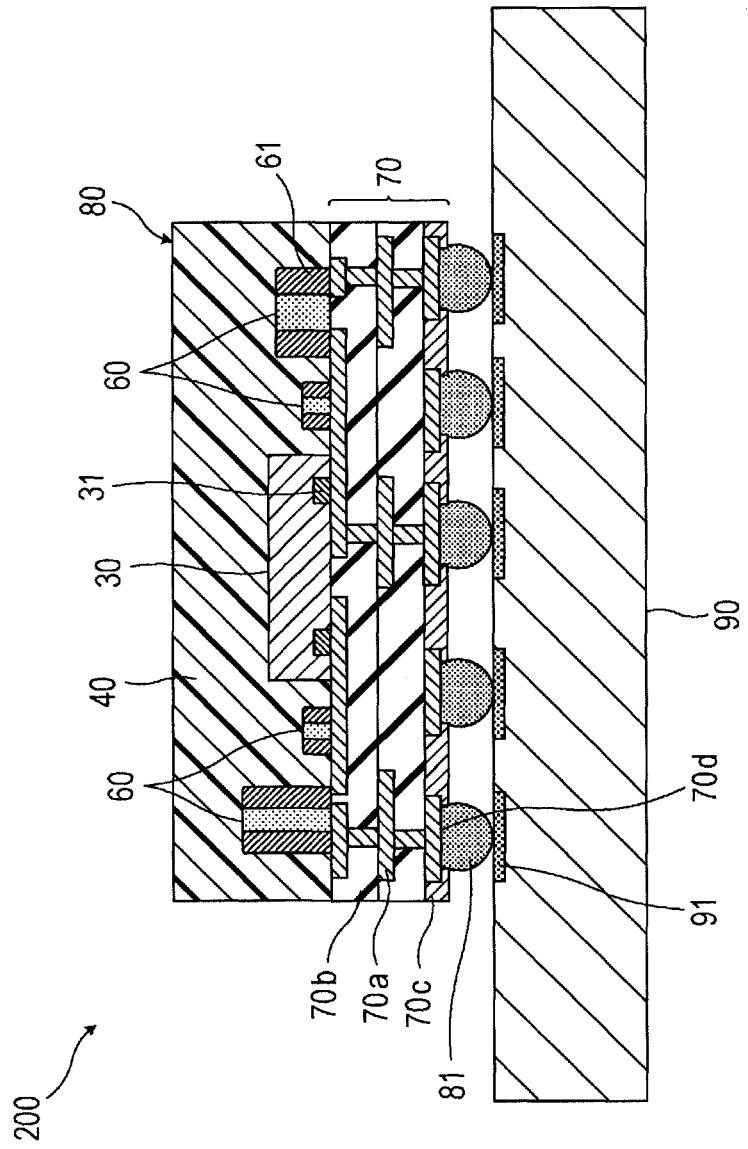
FIG. 18 illustrates an example of an electronic assembly.

FIG. 18 illustrates an example of an electronic assembly. In FIG. 18, a section of a main portion of an example electronic assembly is schematically illustrated.

An electronic assembly 200 illustrated in FIG. 18 includes the semiconductor device 80 and a circuit substrate 90. The semiconductor device 80 includes bumps 81, which are solder balls or the like, mounted on external connection terminals 70*d* of the wiring layer 70. The semiconductor device 80 is electrically connected to electrode pads 91 of the circuit substrate 90 using the bumps 81 and mounted on the circuit substrate 90.

As described above, the semiconductor device 80 having been singulated may be mounted on the circuit substrate 90 and used for the electronic assembly 200. By using the semiconductor device 80, which may be manufactured by reduced time and cost, the electronic assembly 200 may be realized at a reduced cost.

Examples are described as follows.

FIRST EXAMPLE

A stainless substrate having a length of 170 mm, width of 170 mm, and thickness of 0.6 mm is used as a support body. Twelve through holes, the diameter of which is 3 mm, are formed by etching at a peripheral portion of a region of the support body on which a dummy wafer is formed. An adhesive layer is formed on the support body. An adhesive layer is formed of an adhesive film mainly made of silicone resin having a thickness of 50 μm. Crater-shaped irregularities, the craters of which have a diameter of 2 μm and a height of 0.3 μm, are formed in the surface of the adhesive film by nanoimprinting. A plurality of bare chips (semiconductor elements), having a length of 5 mm, a width of 5 mm, and a thickness of 0.4 mm, are equally spaced on the adhesive layer using a flip chip bonder with an electrode surface of each bare chips in contact with a surface of the adhesive layer and sealed with a resin layer using a mold. The resin layer is cured at 120° C. for 15 minutes, thereby forming a dummy wafer having a thickness of 0.6 mm and a diameter of 150 mm. The dummy wafer is removed from the adhesive layer by external forces applied thereto through the 12 through holes formed in the support body while the state of the wafer is maintained. At this time, significant misalignment in position, which may cause a problem later in the formation of a wiring layer, is not observed among the equally spaced bare chips. It is also observed that, after the dummy wafer is removed, the shape of the surface of the adhesive layer is maintained in the substantially same state as an initial state is which the bare chips were not bonded thereto.

After that, the dummy wafer is heated at 200° C. for one hour and completely cured. A surface of the dummy wafer, the surface being a surface removed from the adhesive layer, is coated with photosensitive epoxy varnish by spin coating, prebaked, exposed to light, developed, cured, and subjected to oxygen plasma treatment. Thus, an insulation layer having a thickness of 8 μm is formed. The insulation layer has openings of 30 μm in diameter, which extend to electrodes of the bare chips. Next, a titanium layer having a thickness of 0.1 μm and a copper layer having a thickness of 0.3 μm are formed by sputtering, thereby forming a seed layer. After that, a photoresist pattern, areas of which where vias or wiring is formed are open, is formed, and copper is electroplated using the seed layer having been formed, thereby forming the vias and the wiring. After electroplating, the photoresist is removed, and part of the seed layer covered by the removed photoresist is removed by wet etching and dry etching. After that, a solder resist is formed with part of the wiring exposed, and surface treatment is performed on the exposed surfaces of the wiring using nickel and gold. The substrate formed of the dummy wafer provided with the wiring layer as described above is cut at specified positions, and singulated semiconductor devices (semiconductor packages) are obtained.

SECOND EXAMPLE

As a support body, an aluminum substrate having a length of 170 mm, a width of 170 mm and a thickness of 0.8 mm is used. A material, which is made by mixing an acrylic resin filler made of particles having an average particle size of 0.2 μm with polyimide resin varnish, is applied on the support body by spin coating and cured at 250° C. for 30 minutes, thereby forming a film having a thickness of 10 μm. The surface of this film is subjected to oxygen plasma treatment. As a result, since the etching rate for the acrylic resin filler in a surface portion of the film is higher than that for the matrix made of polyimide resin, crater-shaped irregularities having a diameter of 0.1 to 0.5 μm and a height of 0.2 to 600 nm are formed. Such a layer having the crater-shaped irregularities in the surface portion thereof is used as an adhesive layer. The diameter or height of the craters may become larger than that of the particles of the acrylic resin filler mixed with polyimide resin because the particles of the acrylic resin filler are aggregated in some cases. The diameter or the height of the craters may become less than that of the particles of the acrylic resin filler because the particles of the acrylic resin filler are not uniformly distributed in the thickness direction in some cases.

While such an adhesive layer is stacked on the aluminum substrate, through holes having a diameter of 5 mm are formed by drilling at four positions in the peripheral portion of a region on which the dummy wafer is formed. Next, a plurality of bare chips (semiconductor elements) having a length of 7 mm, width of 4 mm, and a thickness of 0.5 mm and a plurality of 0603-sized (having a length of 0.6 mm, a width of 0.3 mm, and a thickness of 0.33 mm) chip capacitors are mounted on the adhesive layer using a mounter machine such that the bare chips and the 0603-sized chip capacitors are equally alternately spaced with respective electrode surfaces in contact with the surface of the adhesive layer. The bare chips and the chip capacitors are sealed with a resin layer using a mold. The resin layer is cured at 130° C. for 10 minutes, thereby forming a dummy wafer having a thickness of 0.8 mm and a diameter of 150 mm. The dummy wafer is removed from the adhesive layer by external forces applied thereto through the four through holes extending through the support body and the adhesive layer while the state of the wafer is maintained. At this time, significant misalignment in position, which may cause a problem later in the formation of a wiring layer, is not observed among the equally alternately spaced bare chips and chip capacitors.

After that, the dummy wafer is heated at 180° C. for one hour and completely cured. A surface of the dummy wafer, the surface removed from the adhesive layer, is coated with photosensitive polybenzoxazole varnish by spin coating, prebaked, exposed to light, developed, cured, and is subjected to oxygen plasma treatment. Thus, a first insulation layer having a thickness of 10 μm is formed. The insulation layer has openings of 30 μm in diameter, which extend to electrodes of the bare chips and chip capacitors. Next, a titanium layer having a thickness of 0.1 μm and a copper layer having a thickness of 0.3.1 μm are formed by sputtering, thereby forming a seed layer. After that, a photoresist pattern, areas of which where vias or wiring is formed are open, is formed, and copper is electroplated using the seed layer having been formed, thereby forming the vias and the wiring of the first wiring layer. After electroplating, the photoresist is removed, and part of the seed layer covered by the removed photoresist is removed by wet etching and dry etching. Thus, a first wiring layer is formed.

Likewise, the first wiring layer is coated with photosensitive polybenzoxazole varnish by spin coating, prebaked, exposed to light, developed, cured, and subjected to oxygen plasma treatment. Thus, a second insulation layer having a thickness of 10 μm is formed. The insulation layer has openings of 30 μm in diameter, which extends to the wiring of the first wiring layer. Next, a titanium layer having a thickness of 0.1 μm and a copper layer having a thickness of 0.3 μm are formed by sputtering, thereby forming another seed layer. After that, a photoresist pattern, areas of which where vias or wiring is formed are open, is formed, and copper is electroplated using the other seed layer having been formed, thereby forming the vias and the wiring of the second wiring layer. After electroplating, the photoresist is removed, and part of the seed layer covered by the removed photoresist is removed by wet etching and dry etching. Thus, the second wiring layer is formed. After that, a solder resist is formed with part of the wiring exposed, and surface treatment is performed on the exposed surfaces of the wiring using nickel and gold. The substrate formed of the dummy wafer provided with the wiring layer as described above is cut at specified positions, and singulated semiconductor devices (semiconductor packages) are obtained.

After the above-described dummy wafer has been remove from the adhesive layer, the surface of the support body on which the adhesive layer is stacked is cleaned. After that, formation of the second dummy wafer is attempted. A dummy wafer equal to the first dummy wafer is successfully formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of manufacturing a semiconductor device, the method comprising:
    providing an adhesive layer on a support body;
    providing a semiconductor element on the adhesive layer;
    providing a resin layer on the adhesive layer, the semiconductor element being provided on the adhesive layer, and forming a substrate on the adhesive layer, the substrate including the semiconductor element and the resin layer; and
    removing the substrate from the adhesive layer,
    wherein an adhesive force of the adhesive layer in a direction in which the substrate is removed is less than an adhesive force of the adhesive layer in a planar direction in which the substrate is formed.

2. The method according to claim 1,
    wherein the adhesive layer has an irregularity on a surface thereof, the substrate being formed on the surface.

3. The method according to claim 2,
    wherein the irregularity is a crater-shaped irregularity.

4. The method according to claim 2,
    wherein the providing of the adhesive layer on the support body includes
        providing a layer that includes a first resin that exhibits an adhesive property on the support body and a particle of a second resin, the particle of the second resin being contained in the first resin, an etching rate of the second resin being higher than the first resin, and
        etching a surface portion of the layer and removing the particle of the second resin existing in the surface portion.

5. The method according to claim 2,
    wherein the providing of the adhesive layer on the support body includes
        providing a layer that exhibits an adhesive property on the support body, and
        pressing a mold against the layer, a surface of the mold having an irregular shape that corresponds to the irregularity.

6. The method according to claim 1,
    wherein the support body has a first through hole, and
    wherein, in the removing of the substrate from the adhesive layer, the substrate is pressed through the first through hole so as to be removed from the adhesive layer.

7. The method according to claim 6,
    wherein the adhesive layer has a second through hole that communicates with the first through hole, and
    wherein, in the removing of the substrate from the adhesive layer, the substrate is pressed through the first through hole and the second through hole so as to be removed from the adhesive layer.

8. The method according to claim 1, further comprising:
    providing a wiring layer on a surface of the substrate after the removing of the substrate from the adhesive layer has been performed, the surface of the substrate being a surface having been removed from the adhesive layer, the wiring layer including an electrically conductive portion that is electrically connected to the semiconductor element.

9. The method according to claim 8, further comprising:
    cutting the resin layer and the wiring layer in an area around the semiconductor element after the providing of the wiring layer has been performed, and obtaining a semiconductor package that includes the resin layer and the wiring layer having been cut and the semiconductor element.

10. A method of manufacturing a semiconductor device, the method comprising:
- providing an adhesive layer on a support body;
- providing a first semiconductor element on the adhesive layer;
- providing a first resin layer on the adhesive layer, the first semiconductor element being provided on the adhesive layer, and forming a first substrate on the adhesive layer, the first substrate including the first semiconductor element and the first resin layer;
- removing the first substrate from the adhesive layer;
- providing a second semiconductor element on the adhesive layer, the first substrate having been removed from the adhesive layer;
- providing a second resin layer on the adhesive layer, the second semiconductor element being provided on the adhesive layer, and forming a second substrate on the adhesive layer, the second substrate including the second semiconductor element and the second resin layer; and
- removing the second substrate from the adhesive layer.

11. The method according to claim 10, wherein an adhesive force of the adhesive layer in a direction in which the first substrate and the second substrate are removed is less than an adhesive force of the adhesive layer in a planar direction in which the first substrate and the second substrate are formed.

12. The method according to claim 11, wherein the adhesive layer has an irregularity on a surface thereof, the first substrate and the second substrate being formed on the surface.

13. The method according to claim 12, wherein the irregularity is a crater-shaped irregularity.

14. A method of manufacturing an electronic assembly, the method comprising:
- providing an adhesive layer on a support body;
- providing a semiconductor element on the adhesive layer;
- providing a resin layer on the adhesive layer, the semiconductor element being provided on the adhesive layer, and forming a substrate on the adhesive layer, the substrate including the semiconductor element and the resin layer; and
- removing the substrate from the adhesive layer;
- providing a wiring layer on a surface of the substrate, the surface having been removed from the adhesive layer, the wiring layer including an electrically conductive portion that is electrically connected to the semiconductor element,
- cutting the resin layer and the wiring layer in an area around the semiconductor element, and obtaining a semiconductor package that includes the resin layer and the wiring layer having been cut and the semiconductor element, and
- mounting the semiconductor package on a circuit substrate,
- wherein an adhesive force of the adhesive layer in a direction in which the substrate is removed is less than an adhesive force of the adhesive layer in a planar direction in which the substrate is formed, and
- wherein, the providing of the wiring layer on the surface of the substrate, cutting of the resin layer and the wiring layer and the obtaining of a semiconductor package, and the mounting of the semiconductor package on the circuit substrate are performed after the removing of the substrate from the adhesive layer has been performed.

* * * * *